United States Patent
Chang et al.

(10) Patent No.: US 9,245,855 B2
(45) Date of Patent: Jan. 26, 2016

(54) METHODS AND APPARATUS TO REDUCE SEMICONDUCTOR WAFER WARPAGE IN THE PRESENCE OF DEEP CAVITIES

(71) Applicant: Texas Instruments Incorporated, Dallas, TX (US)

(72) Inventors: Simon Y S Chang, Plano, TX (US); Thomas W. Lassiter, Garland, TX (US); Jamie T. Stapleton, Dallas, TX (US); Maciej Blasiak, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/674,584

(22) Filed: Mar. 31, 2015

(65) Prior Publication Data

US 2015/0380363 A1 Dec. 31, 2015

Related U.S. Application Data

(60) Provisional application No. 62/018,820, filed on Jun. 30, 2014.

(51) Int. Cl.

| H01L 29/06 | (2006.01) |
|---|---|
| H01L 23/00 | (2006.01) |
| H01L 21/3065 | (2006.01) |
| B81C 1/00 | (2006.01) |
| B81B 7/00 | (2006.01) |
| H01L 21/308 | (2006.01) |

(52) U.S. Cl.
CPC ............ *H01L 23/562* (2013.01); *B81B 7/0058* (2013.01); *B81C 1/00531* (2013.01); *H01L 21/3065* (2013.01); *H01L 21/3081* (2013.01); *H01L 29/0692* (2013.01)

(58) Field of Classification Search
CPC ...................................................... H01L 23/562
USPC ......................................................... 257/622
See application file for complete search history.

(56) References Cited

U.S. PATENT DOCUMENTS

| 6,339,251 B2 | 1/2002 | Ha et al. |
| 6,685,844 B2 | 2/2004 | Rich et al. |
| 7,723,141 B2 | 5/2010 | Robert |

*Primary Examiner* — Anthony Ho
(74) *Attorney, Agent, or Firm* — Jacqueline J. Garner; Frank D. Cimino

(57) ABSTRACT

Methods and apparatus for forming structures to reduce wafer warpage. A method includes providing a semiconductor wafer having a plurality of integrated circuits; providing a photomask defining a plurality of cavities to be formed by an etch on a backside surface of the semiconductor wafer; defining structural support areas for the backside surface, the structural support areas being contiguous areas; providing areas on the photomask that correspond to the structural support areas, the structural support areas being areas that are not to be etched; using the photomask, performing an etch on the backside surface of the semiconductor wafer to form the cavities by removing semiconductor material from the backside surface of the semiconductor wafer; and the structural supports on the backside of the semiconductor wafer formed as areas that are not subjected to the etch. Additional methods and apparatus are also disclosed.

12 Claims, 9 Drawing Sheets

METHODS AND APPARATUS TO REDUCE SEMICONDUCTOR WAFER WARPAGE IN THE PRESENCE OF DEEP CAVITIES

RELATED APPLICATIONS

The present application claims priority to U.S. Provisional Application Ser. No. 62/018,820 filed on Jun. 30, 2014, entitled "Structures to Reduce Wafer Warpage During Deep Silicon Cavity Etch," which is hereby incorporated in its entirety herein by reference.

TECHNICAL FIELD

The present application relates to the field of integrated circuits and more specifically to methods and structures for reducing warpage of integrated circuit wafers in the presence of deep cavities on the backside of the wafer.

BACKGROUND

Wafer warpage during the processing of semiconductor wafers is an ongoing issue which, when not contained, results in many undesirable consequences that increase costs. Some typical undesirable consequences may be simply having sections of the lithography being out of focus, causing imperfection in the integrated circuits being formed on the wafer, which affects the final usable device yield. In more severe examples, complete breakage of the wafer during processing may result, causing loss of the wafer and the economic loss of all the value of prior processing. In the cases where a wafer breakage occurs, the down time associated with cleaning the processing tool from all the wafer pieces further reduces throughput and increases costs. In extreme cases, the processing tool itself can be damaged resulting in repair costs in addition to the down time for cleaning the tool.

Some factors that have increased the significance and incidence of wafer warpage include the increase in wafer diameters from 200 mm to 300 mm, the ability and requirement to thin the wafers during production so that the finished integrated circuits will fit in thinner packages, and the additional complexity of fabrication processes that build comparatively more layers and which perform more heat treatments, increasing thermal stress.

Of special interest is the fabrication of Micro Electrical Mechanical (MEMs) devices. Some processes in the fabrication of the MEMs devices involve performing deep etches in the final stages of semiconductor processing, after much of the costly fabrication steps have already been completed. Some of these deep etches are performed on the backside of the wafer, that is, after the MEMs devices and other circuitry are processed on the front side, the backside is processed while the completed devices are disposed on the front side. These deep etches can remove a substantial portion of the wafer material which may also result in the reduction of structural integrity of the wafer. One example of such an etch is a process known as Deep Reactive Ion Etching (DRIE) which is capable of performing very deep, high aspect ratio, anisotropic etches in silicon and polycrystalline silicon (polysilicon).

FIG. 1A depicts a top view of a wafer, and FIG. 1B depicts a cross section of the wafer of FIG. 1A illustrating wafer warpage following a deep etch, and FIG. 1C depicts an alternate warpage in the cross section of FIG. 1A. A top view 100 illustrates a semiconductor wafer 102 with a number of rows and columns of multiple integrated circuits (ICs) 104. In FIG. 1A the wafer 102 is depicted during fabrication while the integrated circuits are still mechanically joined. The cross sections labeled FIG. 1B and FIG. 1C illustrate two of the possible wafer warpage effects that can occur. In FIG. 1B, wafer 102 is shown with the edges of the wafer lifted up away from the ideal flat line 122a. In another example, FIG. 1C, wafer warpage is depicted as an "S" type warpage where the left side is lifted away from the ideal flat line 122b and the right side of wafer 102 is depressed below the ideal flat line 122b. These 2 example warpages show warpage across the entire wafer, however, the wafer 102 can develop localized warpage where one area is flat and another is warped. The wafer warpage can affect subsequent processing steps and cause failed devices due to lithography errors, alignment errors or other process errors. In extreme cases the entire wafer can be lost due to the warpage.

Improvements in the manufacture of semiconductor wafers to reduce or eliminate problems associated with wafer warpage are therefore needed and desired. Reduction or elimination of wafer warpage in processes that include backside etches, such as in producing MEMS devices with deep cavities, are particularly needed.

SUMMARY

In arrangements that form various aspects of the present application, the arrangements address reduction or elimination of wafer warpage in semiconductor processes. In the arrangements, mechanical support is provided on wafers that are subject to backside etch processes to reduce or eliminate the warpage that would otherwise occur. Use of the novel arrangements increases device yield and lowers costs for the devices produced and further prevents wafer breakage during processing, thereby eliminating the need to clean or repair process tools that can be damaged by broken wafers, and further eliminating the loss of otherwise functional integrated circuits that can occur in prior known approaches.

In an example arrangement, a method includes providing a semiconductor wafer having a plurality of integrated circuits formed on a front side and having a backside surface; providing a photomask defining a plurality of cavities to be formed by an etch on the backside surface, the cavities corresponding to selected ones of the plurality of integrated circuits; defining structural support areas for the backside surface of the semiconductor wafer, the structural support areas being contiguous areas; providing areas on the photomask that correspond to the structural support areas, the structural support areas being areas that are not to be etched; using the photomask, performing an etch on the backside surface of the semiconductor wafer to form the cavities by removing semiconductor material from the backside surface of the semiconductor wafer; and the structural supports on the backside of the semiconductor wafer formed as areas that are not subjected to the etch.

In an additional arrangement of the present application, a semiconductor wafer, includes a plurality of integrated circuit devices arranged on a front side of the semiconductor wafer in rows and columns; a plurality of cavities on the surface of the backside of the semiconductor wafer and extending into the semiconductor wafer; and a plurality of structural supports formed on the backside of the semiconductor wafer, the structural supports formed of semiconductor material free from the cavities.

In an alternative arrangement of the present application, a semiconductor wafer device includes a plurality of integrated circuit devices arranged on a front side of the semiconductor wafer device in rows and columns, the integrated circuit devices further comprising MEMs devices; a plurality of cavities on the surface of the backside of the semiconductor wafer device and extending into the semiconductor wafer to the MEMs devices; and a plurality of structural supports formed on the backside of the semiconductor wafer device, the structural supports formed of semiconductor material free from the cavities.

Use of the arrangements provides a semiconductor wafer with increased mechanical strength in the presence of deep etched areas or cavities on the backside of the wafer, increasing device yield, lowering costs and reducing or eliminating wafer breakage and device failures that occur when using prior known approaches.

BRIEF DESCRIPTION OF THE DRAWINGS

For a more complete understanding of the illustrative examples of aspects of the present application that are described herein and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the illustrative example arrangements and are not necessarily drawn to scale.

DETAILED DESCRIPTION

The making and using of various example illustrative arrangements that incorporate aspects of the present application are discussed in detail below. It should be appreciated, however, that the illustrative examples disclosed provide many applicable inventive concepts that can be embodied in a wide variety of specific contexts. The specific examples and arrangements discussed are merely illustrative of specific ways to make and use the various arrangements, and the examples described do not limit the scope of the specification, nor do they limit the scope of the appended claims.

For example, when the term "coupled" is used herein to describe the relationships between elements, the term as used in the specification and the appended claims is to be interpreted broadly, and while the term "coupled" includes "connected", the term "coupled" is not to be limited to "connected" or "directly connected" but instead the term "coupled" may include connections made with intervening elements, and additional elements and various connections may be used between any elements that are described as "coupled."

Aspects of the present application involve forming structural shapes, including but not limited to beams and/or islands, on a semiconductor wafer that can improve the structural integrity of the wafer and hence prevent, reduce or eliminate wafer warpage. Because the wafer warpage can vary with the number of metal layers, the types of integrated circuits, the wafer thickness, and other characteristics of particular wafers, different structural improvement may be needed depending on the warpage characteristics. The following figures illustrate various possible arrangements of the present application. It is contemplated by the inventors that there are other permutations of the structural areas that are not specifically illustrated in the non-limiting examples presented here. These variations form additional arrangements that are aspects of the present application.

Figure 1A:
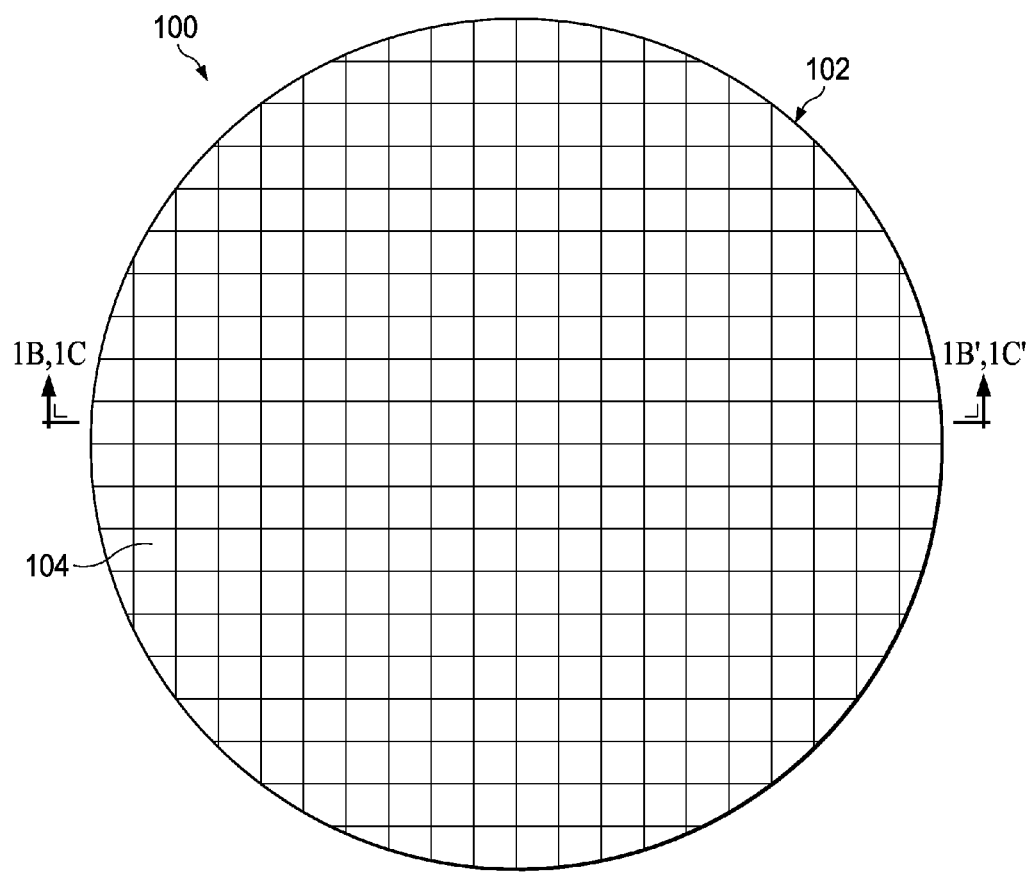
FIG. 1A depicts a top view of a wafer.
Figure 1B:
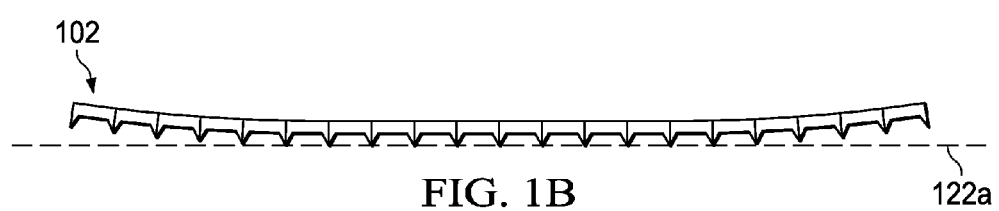
FIG. 1B depicts a cross section of the wafer of FIG. 1A illustrating wafer warpage following a deep etch.
Figure 1C:
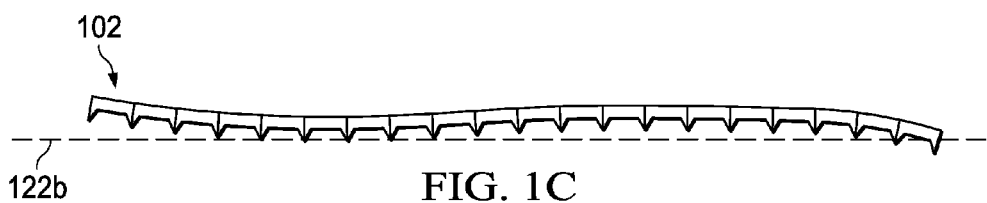
FIG. 1C depicts an alternate warpage in the cross section of FIG. 1A.
Figure 2:
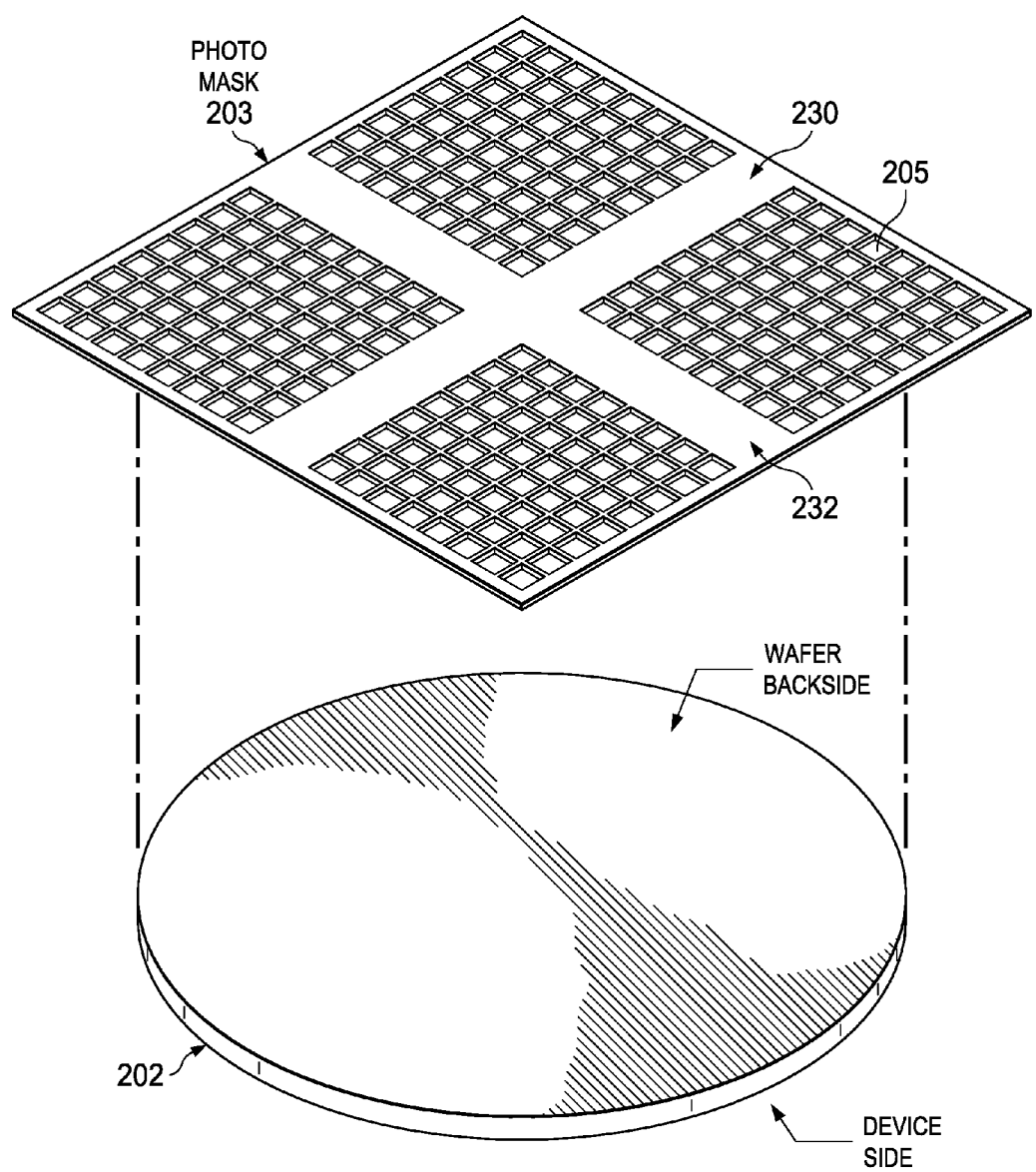
FIG. 2 depicts a wafer and a mask showing a first aspect of the present application.

FIG. 2 depicts a wafer and a mask showing a first aspect of the present application. Wafer 202 is shown being prepared for a deep etch operation on the backside of the wafer using a photomask 203. The pattern on mask 203 is arranged to form cavities in an etch process (yet to be performed) on the backside of the wafer 202. These cavities can correspond to corresponding areas on the back portions of the wafer. In one possible arrangement each cavity area on the mask is positioned to cause a cavity to be formed beneath integrated circuit dies that are already formed on the front side surface or the "device side." A structural pattern 205 is shown applied to the mask 203. In this non-limiting example arrangement, the structural pattern 205 is formed to block the etching operation in a cross shape arrangement made from two intersecting beams, shown as 230 and 232. In one arrangement of the present application, the structural arrangement can be included when the photomask 203 is first produced. In another alternative arrangement that is also contemplated as an aspect of the present application, a photomask with a prior known cavity etch pattern that covers the entire surface of the backside of a wafer can be modified to incorporate the arrangements of the present application. This modification is done by masking portions of the etch pattern to form the support structures on the wafer during etch. In one example, the modification to the existing mask is performed as a blocking operation, the etch that occurred in the prior known approaches in certain portions of the semiconductor wafer using the photomask is now blocked by modifying the mask to prevent etch in the areas of the semiconductor wafer where the structural supports are desired. By modifying an existing prior known photomask, the arrangements of the present application can be easily incorporated into a semiconductor process without the need to manufacture new masks for the etch step that forms the cavities. The structural supports are intentionally added areas where no cavities will be formed, and are wider than the spacing between cavities. In an example arrangement the structural supports may have a width greater than the width of an integrated circuit. In another arrangement the structural supports may have a width greater than the width of a cavity opening and the spacing between adjacent rows of cavities. The added structural supports provide additional mechanical strength to the wafer, but at a cost of adding an area to the backside of the wafer where the cavities are not formed, thus the integrated circuits on the device side of the wafer that are positioned in areas corresponding to the areas of the structural supports added by the use of the arrangements will not be functional devices. A design trade off is thus created between added mechanical strength, and reduced device yield, by use of the structural supports.

Figure 3A:
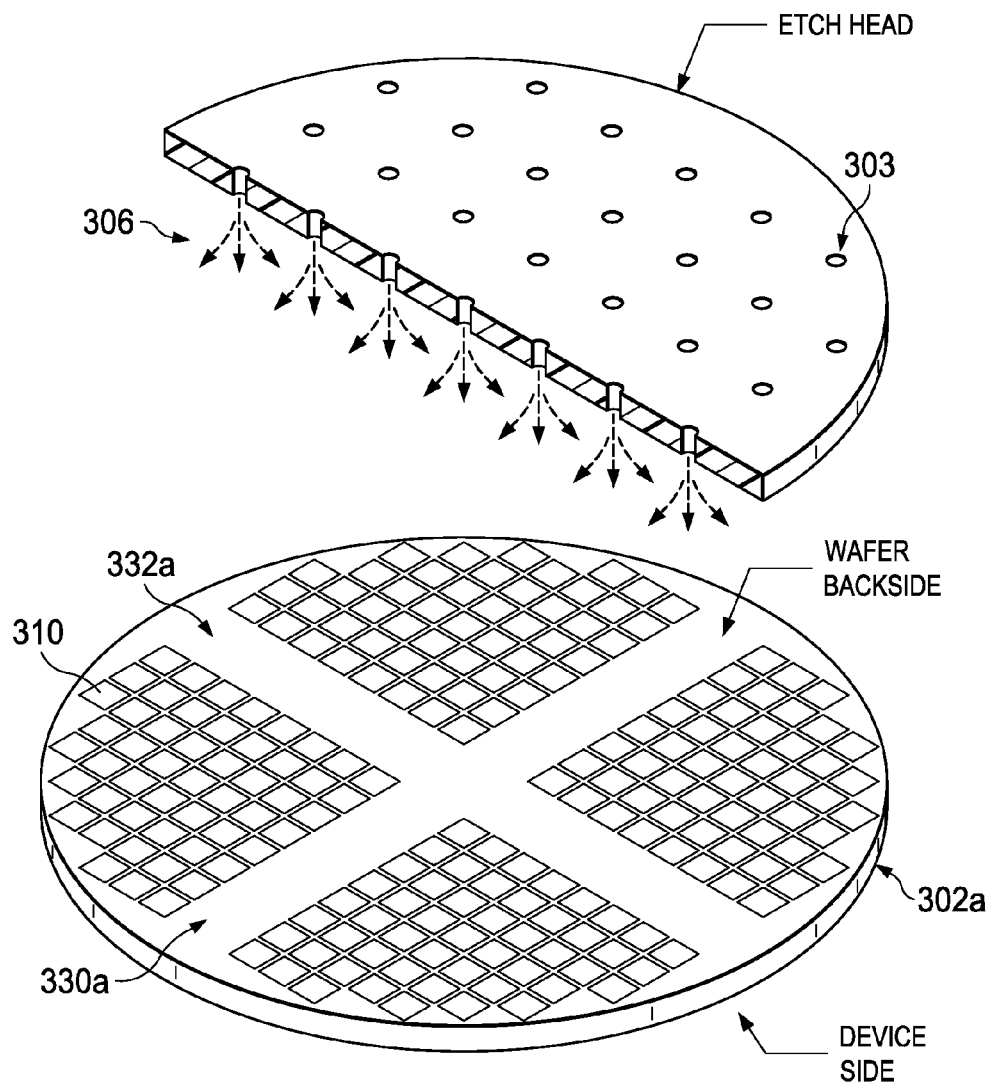
FIG. 3A depicts a wafer during an etch process for forming openings or cavities on the backside of the wafer.
Figure 3B:
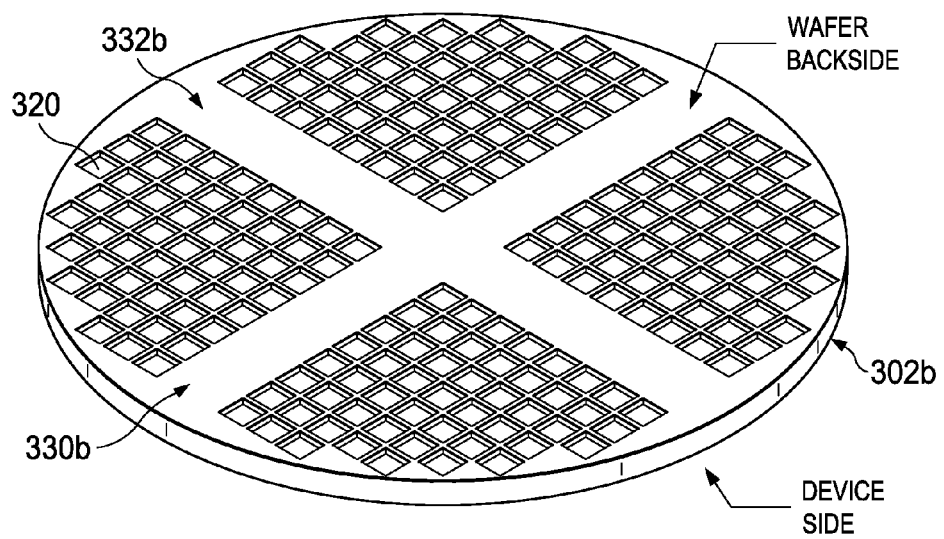
FIG. 3B depicts the wafer following the etch process.

FIG. 3A depicts a wafer during an etch process for forming openings or cavities on the backside of the wafer, and FIG. 3B depicts the wafer following the etch process. In FIG. 3A, semiconductor wafer 302a is shown with a photoresist pattern forming openings 310 on the backside of selected integrated circuits. Etchants illustrated as 306 flowing thru nozzles 303 in the etch head 301 will form cavities 320 on the backside of wafer 302a. FIG. 3B depicts the wafer (now 302b) following the etch process of FIG. 3A. The etch process shown in FIG. 3A can be a DRIE process, for example, and can form cavities or openings shown as 320 in FIG. 3B. In certain applications the cavities can be quite large, and can be quite deep, with a cavity opening ratio that is greater than 60%, for example. That is, the openings can be anisotropic holes with great depth compared to the diameter of the opening. In one arrangement, the openings 320 can extend to a portion of a MEMs device previously formed on the front side or device side of the wafer 302b. The resulting cavities such as 320 can be used, for example, to form a lens opening for a MEMS device or a photocell. In other applications the cavities can be formed for other reasons.

In addition, in the example arrangement shown in FIGS. 3A and 3B, structural support features 330b and 332b are shown in FIG. 3B. In the areas covered by the support features 330b and 332b, the cavities were not formed. In one arrangement, the photoresist has been patterned with the beam areas 330a, 332a to define an area where etching will not occur, as shown on wafer 302b. The beams 330b, 332b in FIG. 3B are therefore formed because the pattern in the photoresist 230a, 232a blocked the etch in these regions. Because the wafer material in these structural supports was not removed, the wafer retains additional mechanical strength due to the beam structures and wafer warpage can be eliminated or can be substantially reduced when compared to the prior known approaches.

Figure 4A:
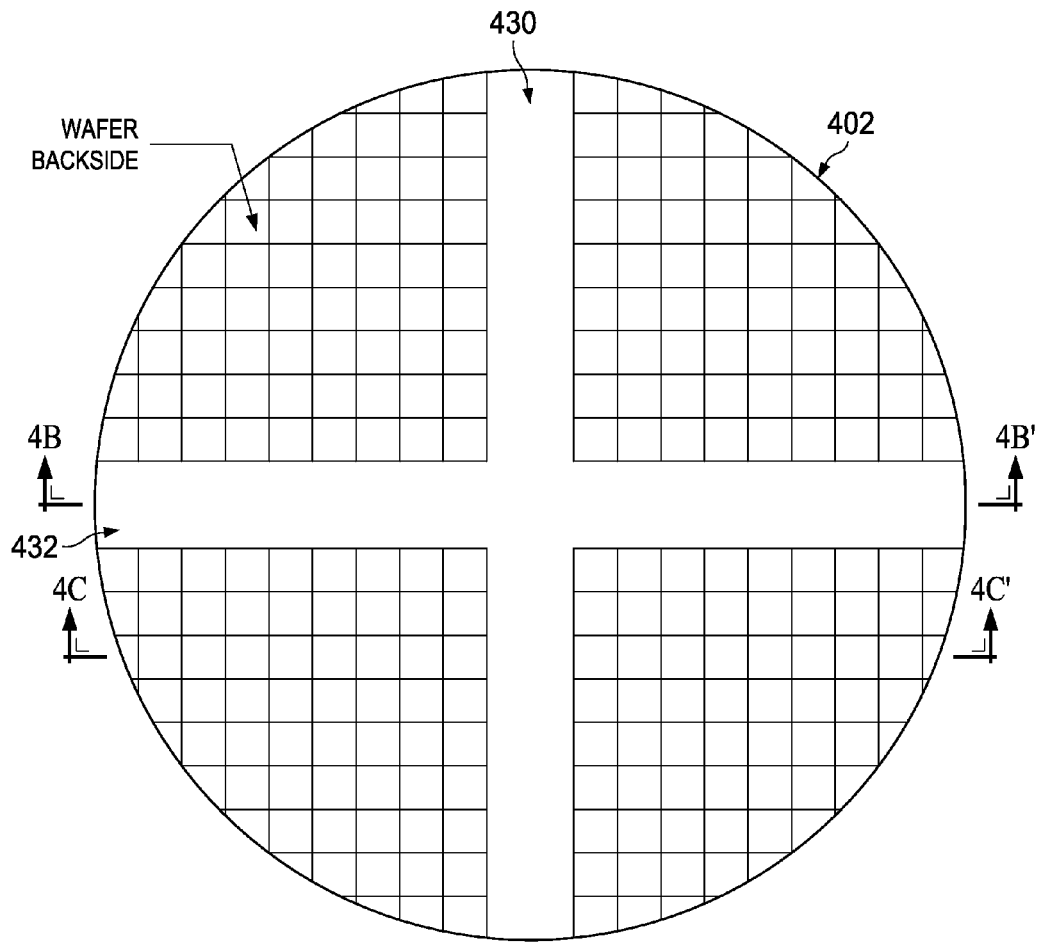
FIG. 4A depicts a wafer and FIGS. 4B, 4C depict cross sections showing a further aspect of the present application.
Figure 4B:
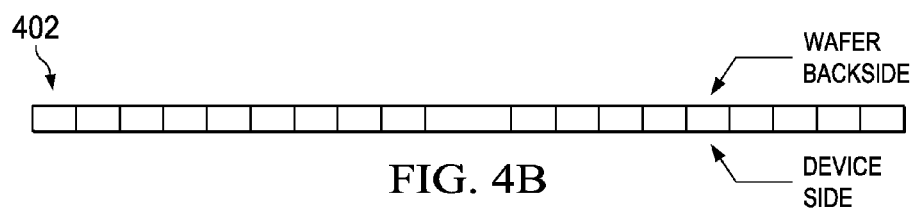
Figure 4C:
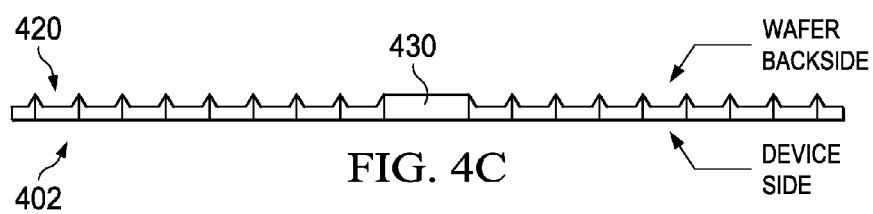

FIG. 4A depicts a wafer and FIG. 4B, 4C depicts cross sections showing a second aspect of the present application. Wafer 402 in FIG. 4A is susceptible to wafer warpage due to the removal of wafer material at cavities 420 depicted on the backside of the wafer in cross section in FIG. 4C. In an aspect of the present application, a set of beams 430 and 432 form structural supports arranged in a cross shape on the backside of wafer 402 shown in FIG. 4A. FIG. 4B illustrates in a cross sectional view a portion of wafer 402 taken along the beam 432 showing that in this area, the backside etch process was prevented from removing wafer material. Similarly, a cross section depicted in FIG. 4C illustrates a portion of wafer 402 with cavities 420 and with a portion of beam 430 where no material was removed. The specific quantity, width and length dimensions of the structural support beams 430 and 432, which are formed to prevent, reduce or eliminate wafer warpage, can be determined empirically for each wafer design based on several factors. Examples of some factors considered in making the determination are the number of rows and columns of integrated circuits, the volume of material etched away, thickness of the wafer, and prior and subsequent wafer processing steps, especially those involving heat treatment. Heating the wafer increases thermal mechanical stresses on the wafer.

Figure 5A:
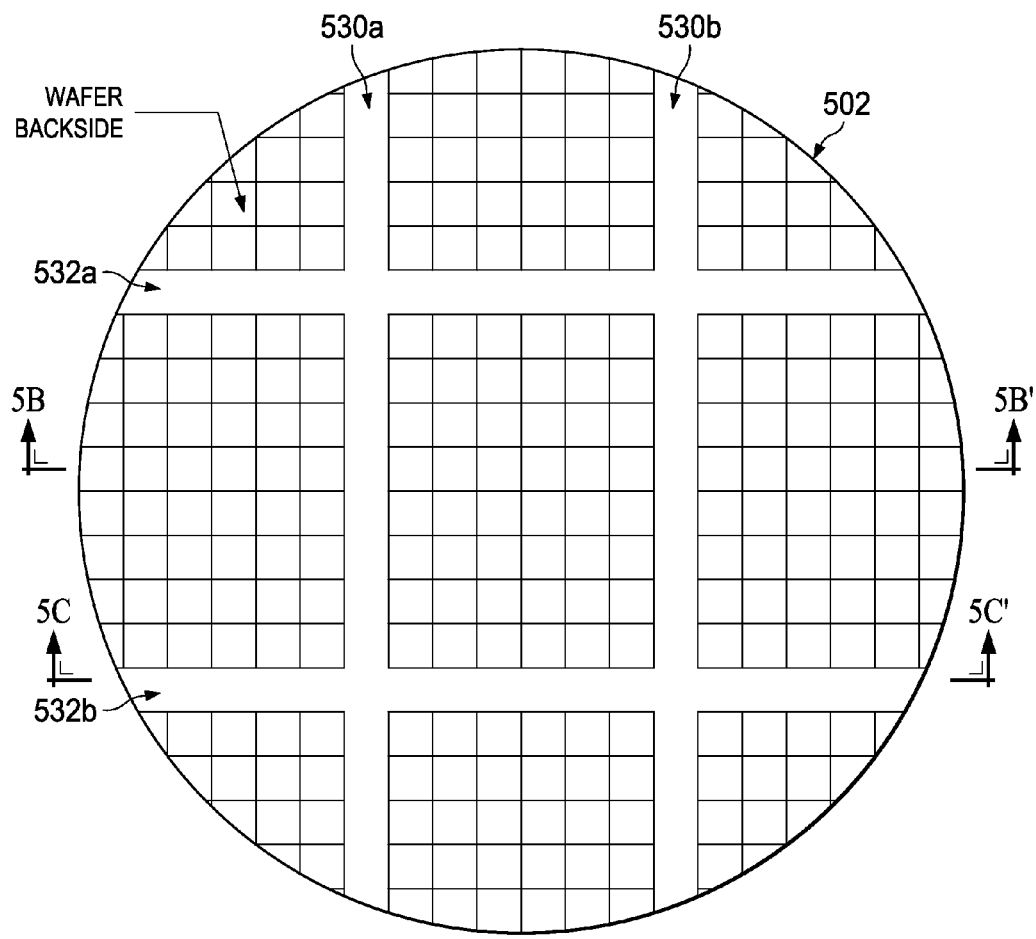
FIG. 5A depicts a wafer and FIGS. 5B, 5C depict cross sections showing yet another aspect of the present application.
Figure 5B:
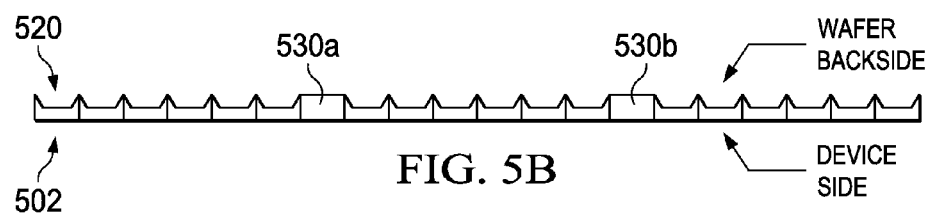
Figure 5C:
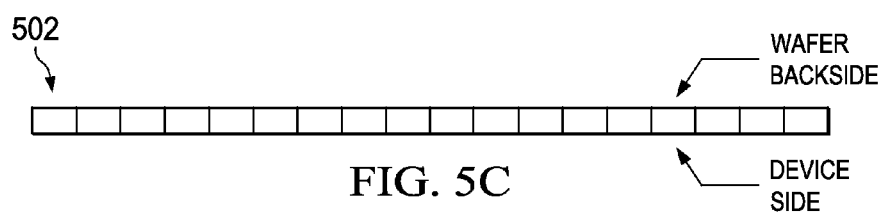

FIG. 5A depicts a wafer and FIGS. 5B, 5C depict cross sections showing yet another aspect of the present application. Wafer 502 is susceptible to wafer warpage due to the removal of material at cavities 520 depicted on the backside of the wafer in the cross section FIG. 5B. In an aspect of the present application, a set of structural supports which are beams 530a, 530b run in one direction, which is generally vertical in the orientation of FIG. 5A, and a second set of beams 532a, 532b run in a perpendicular direction to beams 530a, 530b. The two sets of beams form structural supports in a single structure, forming a double cross pattern on the wafer 502. FIG. 5B illustrates a portion of wafer 502 in a cross sectional view with cavities 520 and with a portion of beams 530a, 530b where no material was removed. FIG. 5C illustrates a portion of wafer 502 in another cross sectional view taken along the beam 532b showing that in this area, the backside etch process was prevented from removing material. Beam 532b is formed by the unremoved material enhancing the structural integrity of the wafer 502. The quantity of beams and the specific width and length dimensions of the beams required to prevent, reduce or eliminate wafer warpage can be determined empirically for each wafer design.

While the mechanical support for the wafer after the backside cavity etch is increased by use of the structural support features of the various arrangements, a design trade-off exists between the area of the structural support features and the number of functional devices that will be formed on the wafer. The trade-off occurs because the areas covered by the structural support features will not be subjected to the deep cavity etch steps and thus, the integrated circuits disposed in these areas will not be completed. Accordingly, the number of the support features, and the wafer area used, should be chosen from empirical observations so as to keep the integrated circuit device yield high while still adding structural support to the wafer in the presence of the deep cavities.

It should be understood that the structural supports are intentionally added areas that have a width that is wider than the spacing between integrated circuit dies and which is wider than a row of the cavity areas and wider than the spacing between cavity areas. In an example arrangement the width of the structural supports can be at least as wide as two rows of the cavity areas. The structural supports are areas that are not etched to form the cavities but which, without the use of the arrangements adding the support, would have been etched to form cavities in the prior known approach. By adding the structural support areas, the wafer is strengthened mechanically with a design trade-off of some loss of area for functional devices, because the added structural support areas do not have the cavities formed which are needed to complete functional devices. The integrated circuits that are on the front side of the wafer in areas corresponding to the structural supports will not have the cavities and therefore will not be completed integrated circuit devices.

Figure 6A:
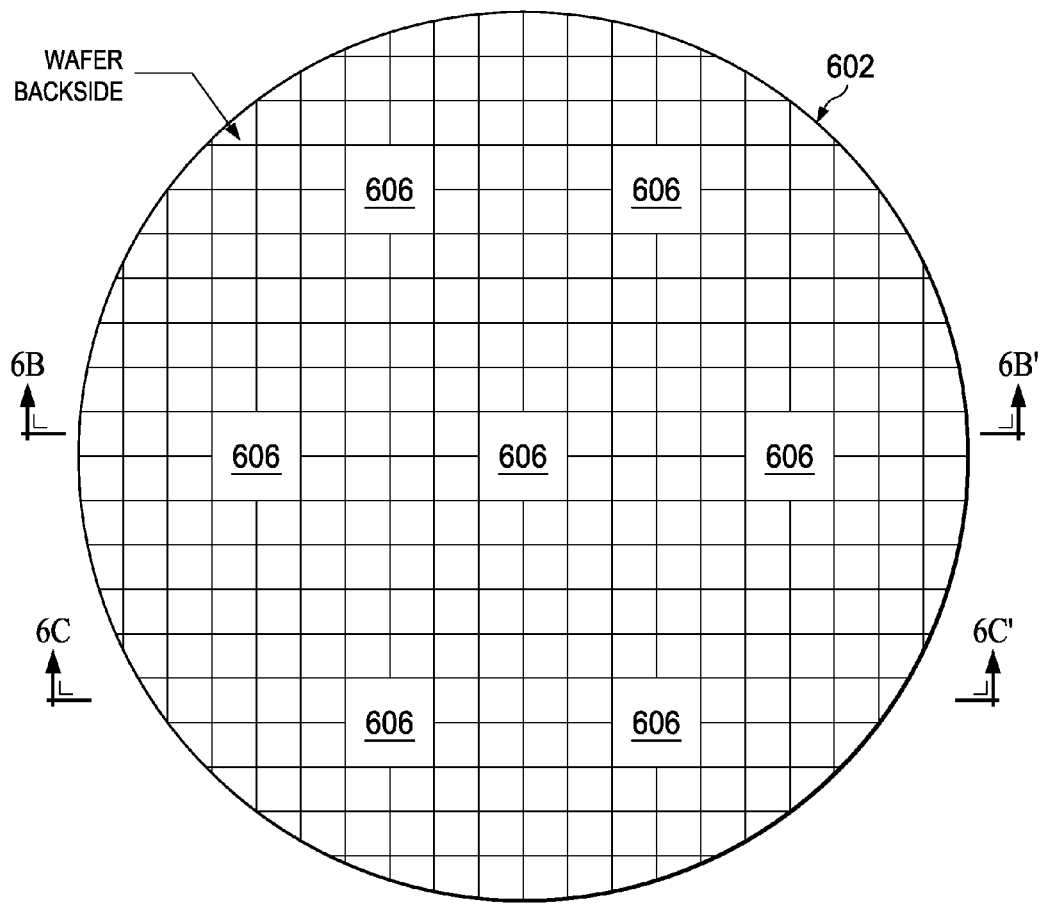
FIG. 6A depicts a wafer and FIGS. 6B, 6C depict cross sections of the wafer showing another aspect of the present application.
Figure 6B:
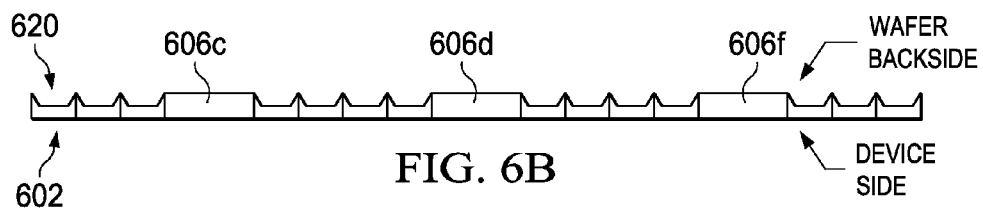
Figure 6C:
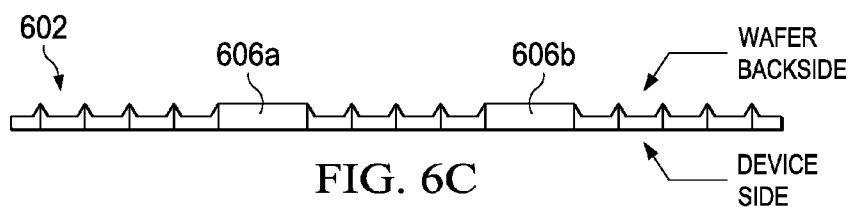

FIG. 6A depicts a wafer 602 and FIGS. 6B, 6C depict cross sections of the wafer 602 showing another aspect of the present application. On wafer 602, which can be susceptible to wafer warpage due to the removal of material in cavities such as 620 depicted on the backside of the wafer in the cross section FIG. 6B, an aspect of the present application is depicted as a series of seven islands 606. FIG. 6B illustrates in a cross sectional view a portion of wafer 602 showing three island sections 606c, 606d, 606e where no semiconductor wafer material was removed. Similarly, FIG. 6C illustrates in another cross sectional view a portion of wafer 602 showing the two island areas 606a, 606b. In the each of the seven island areas 606 the backside etch process was prevented from removing material, which creates a section of silicon to enhance the structural integrity of the wafer. The specific size and quantity of the islands 606 needed to prevent, reduce or eliminate wafer warpage can be determined empirically for each wafer design. While the mechanical support is increased by use of the islands, a design trade-off exists between the area of the islands and the number of functional devices that will be formed on the wafer, the areas covered by the islands will not be subjected to the deep cavity etch steps and thus, the integrated circuits in these areas will not be completed. Accordingly, the number of the islands, and the area used, should be chosen from empirical observations to keep device yield high while adding structural support to the wafer.

Figure 7A:
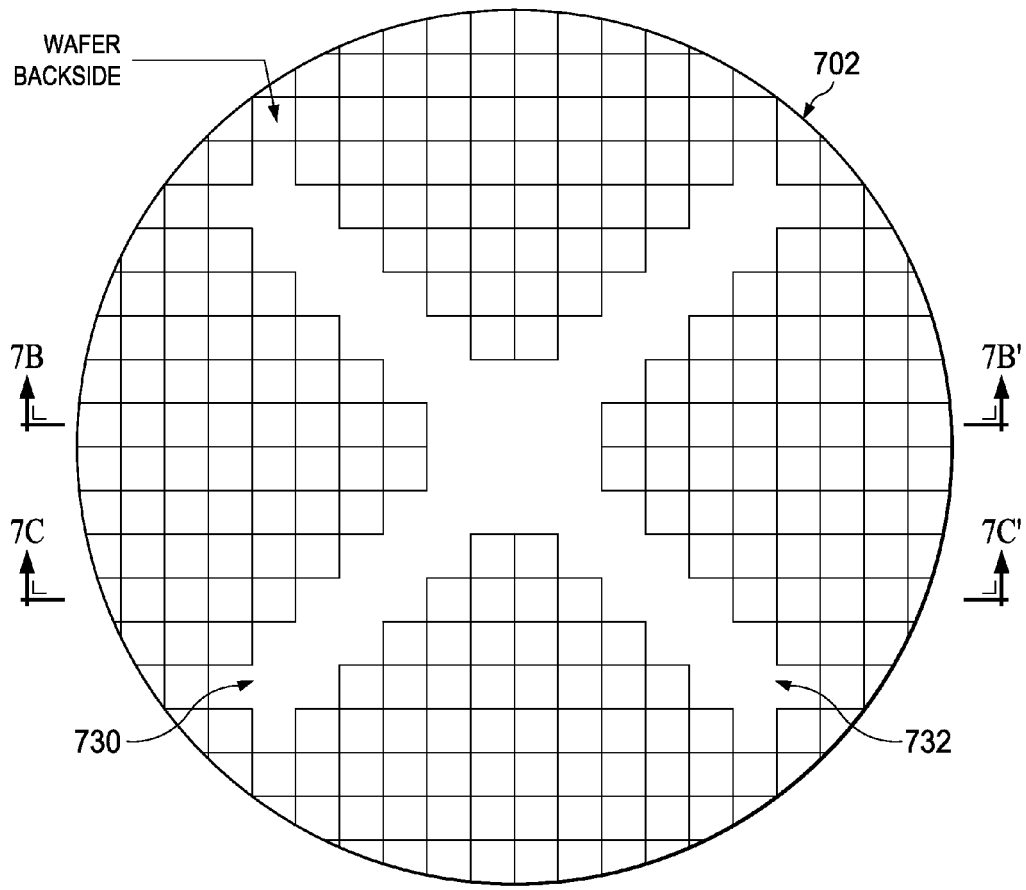
FIG. 7A depicts a wafer and FIGS. 7B, 7C depicts cross sections showing another aspect of the present application.
Figure 7B:
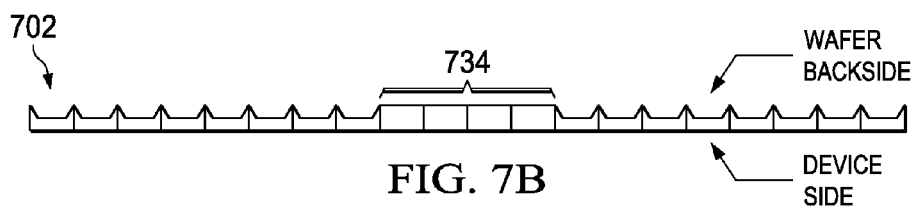
Figure 7C:
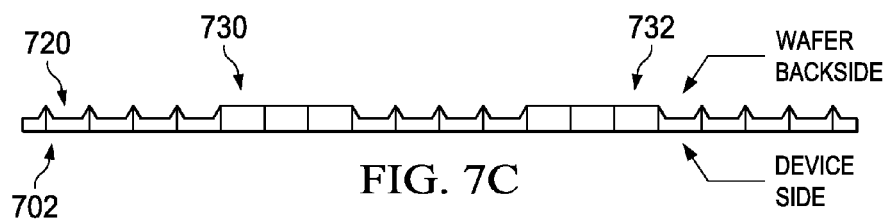

FIG. 7A depicts a wafer and FIG. 7B, 7C depicts cross sections showing another aspect of the present application. Wafer 702 is susceptible to wafer warpage due to the removal of material forming cavities 720 depicted on the backside of the wafer in cross section in FIG. 7C. In yet another arrangement that forms an aspect of the present application, a set of beams 730 and 732 that are structural supports are formed into an "X" is shown in FIG. 7A. FIG. 7B illustrates a portion of wafer 702 in a cross section taken through the intersection of the beams 730 and 732. At the intersection of the beams 734 in FIG. 7B, the backside etch process was prevented from removing material. Similarly, a cross section depicted in FIG. 7C illustrates a portion of wafer 702 with cavities 720 and with a portion of beam 730 and beam 732 where no material was removed. The specific quantity, width and length dimensions of the beams 730 and 732 needed to prevent, reduce or eliminate wafer warpage is determined empirically for each wafer design based on several factors. The trade-off between device yield and added structural strength described above must be evaluated.

Figure 8:
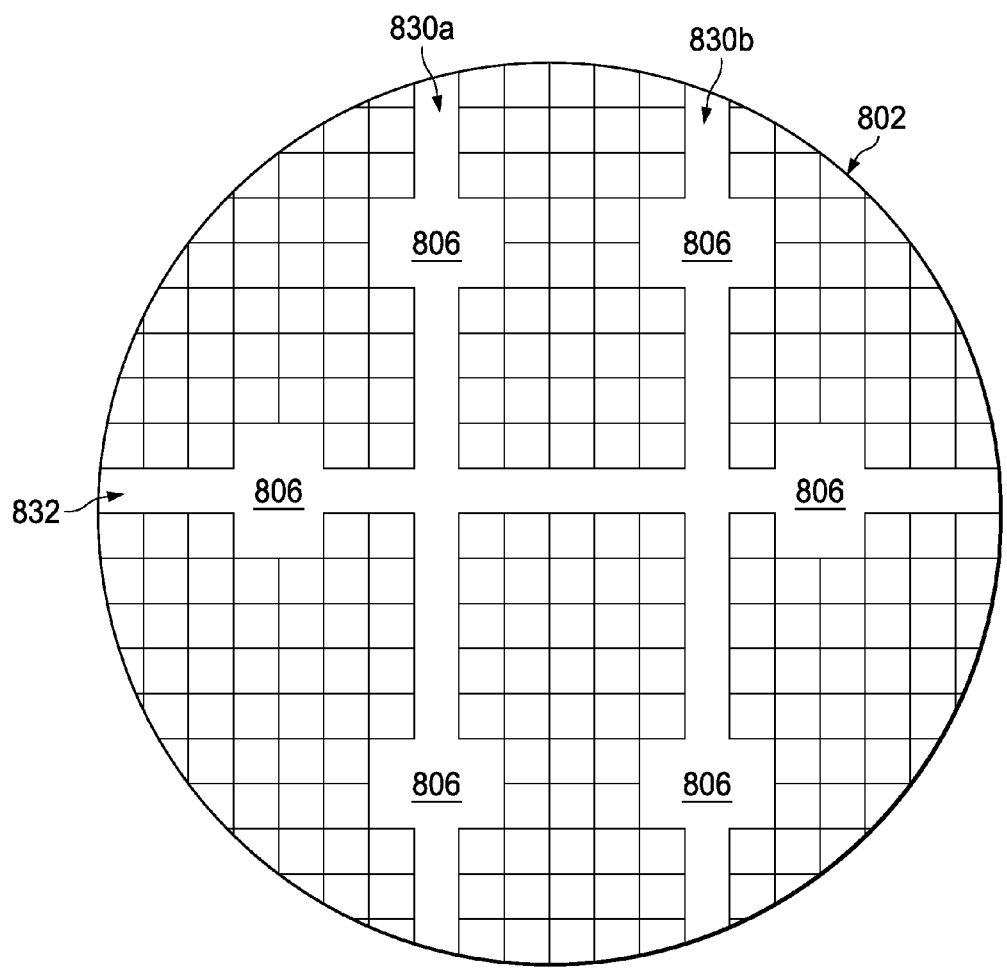
FIG. 8 depicts a wafer showing another aspect of the present application.

FIG. 8 depicts a wafer showing another aspect of the present application. On wafer 802, a combination of the vertical beams 830a, 830b, which are similar to beams 530a and 530b in FIG. 5A, the horizontal beam 832, which is similar to beam 532a in FIG. 5A, and seven islands 806, similar to islands 606 in FIG. 6A are combined to form another arrangement that forms an aspect of the present application. It is contemplated that the combination of any quantity and configuration of shapes in the creation of sections to enhance the structural integrity of the wafer. The specific size, quantity and combination of the areas required, if any, to reduce or eliminate wafer warpage can be determined empirically for each wafer design. Examples of some factors considered in making the determination are the number of rows and columns, volume of material etched away, thickness of the wafer, and prior processing steps, especially those involving heat treatment.

Various modifications can also be made in the order of steps and in the number of steps to form additional novel arrangements that incorporate aspects of the present application, and these modifications will form additional alternative arrangements that are contemplated by the inventors as part of the present application and which fall within the scope of the appended claims.

Although the example illustrative arrangements have been described in detail, it should be understood that various changes, substitutions and alterations can be made herein without departing from the spirit and scope of the present application as defined by the appended claims.

Moreover, the scope of the present application is not intended to be limited to the particular illustrative example arrangement of the process, machine, manufacture, and composition of matter means, methods and steps described in this specification. As one of ordinary skill in the art will readily appreciate from the disclosure, processes, machines, manufacture, compositions of matter, means, methods or steps, presently existing or later to be developed, that perform substantially the same function or achieve substantially the same result as the corresponding example arrangements described herein may be utilized according to the illustrative arrangements presented and alternative arrangements described, suggested or disclosed. Accordingly, the appended claims are intended to include within their scope such processes, machines, manufacture, compositions of matter, means, methods, or steps.

What is claimed is:

1. A method, comprising:
   providing a semiconductor wafer having a plurality of integrated circuits formed on a front side, and having a backside surface;
   providing a photomask defining a plurality of cavities to be formed by an etch on the backside surface, the cavities corresponding to selected ones of the plurality of integrated circuits;
   defining structural support areas for the backside surface of the semiconductor wafer, the structural support areas being contiguous areas;
   providing areas on the photomask that correspond to the structural support areas, the structural support areas being areas that are not to be etched;
   using the photomask, performing an etch on the backside surface of the semiconductor wafer to form the cavities by removing semiconductor material from the backside surface of the semiconductor wafer; and
   wherein the structural supports on the backside of the semiconductor wafer are formed as areas that are not subjected to the etch.

2. The method of claim 1, wherein the structural supports further comprise a plurality of intersecting beams of semiconductor material that were not subjected to the etch.

3. The method of claim 2 wherein the providing the plurality of intersecting beams further comprises:
   providing a first plurality of beams running across the semiconductor wafer and arranged in parallel in a first direction; and
   providing a second plurality of beams running across the semiconductor wafer and arranged in parallel in a second direction that is perpendicular to the first direction.

4. The method of claim 1, wherein providing the structural supports further comprises providing a first beam running across a middle portion of the semiconductor wafer in a first direction, and providing a second beam running across the middle portion of the semiconductor wafer in a second direction different from the first.

5. The method of claim 4, wherein the first and second directions are perpendicular to one another and the first and second beams form a cross pattern.

6. The method of claim 4, wherein the first and second directions are angled to one another and the first and second beams form an X pattern.

7. The method of claim 1, wherein providing the structural supports on the semiconductor wafer further comprise providing a plurality of island areas.

8. The method of claim 7 wherein providing the island areas comprise an area of the semiconductor wafer that is greater than 10 percent of the surface area.

9. The method of claim 1, wherein providing the integrated circuits further comprise providing MEMS devices.

10. The method of claim 9, wherein defining the plurality of cavities further comprises providing lens openings for the MEMS devices.

11. The method of claim 1, wherein the etch is a reactive ion etch.

12. The method of claim 1, wherein the etch is a direct reactive ion etch.

* * * * *